United States Patent [19]
Soyano et al.

[11] Patent Number: 5,625,536
[45] Date of Patent: Apr. 29, 1997

[54] SEMICONDUCTOR DEVICE

[75] Inventors: Shin Soyano; Susumu Toba, both of Nagano, Japan

[73] Assignee: Fuji Electric Co., Ltd., Kawasaki, Japan

[21] Appl. No.: 566,956

[22] Filed: Dec. 4, 1995

[30] Foreign Application Priority Data

Dec. 8, 1994 [JP] Japan .................. 6-304933

[51] Int. Cl.$^6$ ...................................... H05K 7/20
[52] U.S. Cl. .................. 361/736; 174/52.2; 257/787; 361/719; 361/823
[58] Field of Search .................. 439/76.1, 936; 174/52.2, 52.3; 257/687, 706, 713, 787, 796; 165/80.3, 185; 361/688, 704, 707, 715, 717–719, 723, 736, 752, 756, 823

[56] References Cited

U.S. PATENT DOCUMENTS

| | | | |
|---|---|---|---|
| 5,012,386 | 4/1991 | McShane | 361/386 |
| 5,067,005 | 11/1991 | Michii | 357/72 |
| 5,173,766 | 12/1992 | Long | 257/687 |
| 5,416,358 | 5/1995 | Ochi | 257/675 |
| 5,467,253 | 11/1995 | Heckman | 361/761 |

FOREIGN PATENT DOCUMENTS

| | | |
|---|---|---|
| 0384482 | 8/1990 | European Pat. Off. . |
| 0513410 | 11/1992 | European Pat. Off. . |
| 0609528 | 8/1994 | European Pat. Off. . |

*Primary Examiner*—Gerald P. Tolin
*Attorney, Agent, or Firm*—Kanesaka & Takeuchi

[57] ABSTRACT

A semiconductor device is formed of an insulative case frame having a frame portion; a lead pin block having a base and a plurality of lead pins with inner leads formed in the base, the lead pin block being installed inside the frame portion; a base plate attached to the frame portion for covering a first opening; a circuit board bonded to an inner face of the base plate and having semiconductor chips thereon connected to ends of the inner leads; a gel resin sealant filling an inner space of the insulative case frame over the circuit board and the semiconductor chips; and an insulative cover plate placed on the insulative case frame for closing a second opening of the insulative case frame. A sealing agent is disposed between the lead pin block and the frame portion to seal a gap therebetween, and an air vent is formed in the base of the lead pin block to communicate between the inner space and atmosphere.

7 Claims, 5 Drawing Sheets

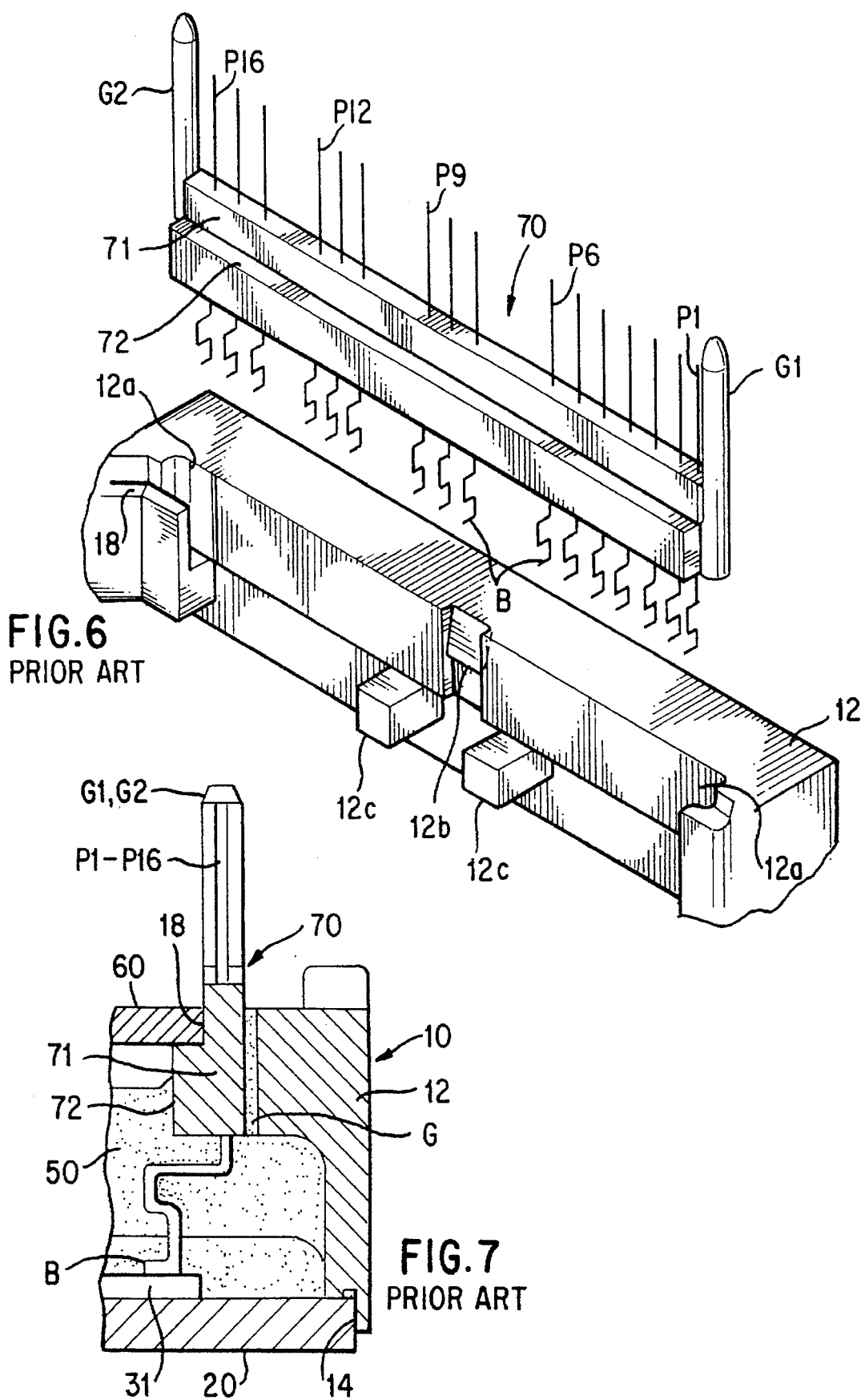

SEMICONDUCTOR DEVICE

BACKGROUND OF THE INVENTION AND RELATED ART STATEMENT

The present invention relates to a semiconductor device called "power module", which houses a circuit board having semiconductor elements thereon in an insulative case frame, and more specifically to a structure for installing a lead pin block on which many lead pins are formed.

FIG. 4 is a top plan view showing a structure of a conventional semiconductor device called "power module" or "intelligent power module". And, FIG. 5 is a cross sectional view taken along line 5—5 in FIG. 4.

As shown in these figures, the semiconductor device has an insulative case frame 10 having a frame portion 12. A radiator base plate or metal plate 20 is bonded with an adhesive to a first opening step 14 formed on a first side of the frame portion 12 to close a first opening of the case frame 10. Circuit boards 30, 31, i.e. ceramic boards, are bonded with a solder and so on to the inside face of the radiator base plate 20. Lead frames 40 through 45 are connected at the inner lead ends A thereof to a thick film wiring formed on the circuit board 30. A lead Din block 70 with lead pins P1 through P16 standing thereon is fixed to the frame portion 12 of the insulative case frame 10. The ends B of inner leads of the respective lead pins P1 through P16 are connected to the thick film wiring formed on the circuit board 31. A gel resin sealant 50, e.g. silicone resin, is filled in an inner space of the case frame 10 to immerse or cover the circuit board 30, the inner leads of the lead frames 40 through 45 and the inner leads of the lead pins P1 through P16. An insulative cover plate 60 is bonded with an adhesive to a second opening step 18 formed on a second side of the frame portion 12 to close the second opening of the case frame 10.

Semiconductor elements or chips 32, 34, such as power transistors, IGBTs (conductivity-modulation-type transistors), diodes, thyristors, and so on are mounted on the circuit boards 30, 31. The inner lead ends A of the lead frames 40 through 45 are bonded with a solder and so on to the land portions of the thick film wiring of the circuit board 30, and connected through bonding wires 32a, 34a to the corresponding semiconductor elements 32, 34.

The lead frames 40 through 45 are fixed to the frame portion 12 by insert molding, and terminal washers 40a through 45a at the frame portion 12 are connected with terminal screws (not shown) for outer connection.

FIG. 6 is an exploded perspective view showing a lead pin block and its installation structure. Referring now to FIG. 6, the lead pin block 70 is molded by an insert molding separately from the insulative case frame 10. The lead pin block 70 includes a base 71 on which the lead pins P1 through P16 are standing, a step 72, a coupling claw (not shown) formed on the other side opposite to the face that the step 72 is formed, and guide pins G1, G2. The upper face of the step 72 is positioned at the same height as the upper face of the second opening step 18 when the step 72 is inserted into slots 12a formed on the inner face of the frame portion 12 of the insulative case frame 10, so as to accept the insulative cover plate 60. The coupling claw couples with a wedge-shaped coupling claw 12b formed on the inner face of the frame portion 12. The guide pins G1, G2 are inserted into respective quiche holes formed on a female connector (not shown) for the lead pins P1 through P16. A pair of support pins 12c, which sustain the inserted lead pin block 70 at the predetermined height, is formed on the inner face of the frame portion 12.

The lead pin block 70 is formed by molding separately from the insulative case frame 10 for reducing the volume of the resin mold to further reduce the influence of the sink and so on of the resin. By this measure, the precision of the pitch between the lead pins and the verticalness of the lead pins P1 through P16 are improved, and therefore, the production yield of the semiconductor device is improved.

The lead pin block 70 is installed on the insulative case frame 10 tightly enough not to come out easily by inserting the lead pin block 70 into the slots 12a and coupling the coupling claw 12b of the frame portion 12 with the coupling claw of the lead pin block 70. Thereafter, as shown in FIG. 7, the gel resin sealant 50, i.e. silicone resin, is filled in the insulative case frame 10, and then closed with the insulative cover plate 60 bonded with an adhesive to the second opening step 18 of the insulative case frame 10 and the step 72 of the lead pin block 70.

The above described structure for installing the lead pin block 70 on the semiconductor module has following drawbacks.

The gel resin sealant 50, i.e. silicone resin, is heated to cause heat expansion due to heating for bonding the insulative cover plate 60 to the insulative case frame 10 or heat generated from the power elements, covered by the gel resin sealant 50, of the operating semiconductor module. The expanding gel resin sealant 50 spreads out through an insertion gap G between the base 71 of the lead pin block 70 and the inner face of the frame portion 12, or lifts up the insulative cover plate 60.

Also, since the lead pins P1 through P16 are extremely fine square rods less than 1 mm in width, the lead pins are easily bent by the unwanted contact and so on during packaging or transporting of the semiconductor module. And, the resin guide pins G1, G2 are easily broken.

In view of the foregoing, it is an object of the invention to provide a semiconductor device for installing a lead pin block that prevents the gel resin sealant from spreading out through the insertion gap between the base of the lead pin block and the inner face of the frame portion.

It is another object of the invention to provide a semiconductor device with a protective structure that prevents the lead pins and guide pins from bending or breaking during transporting and so on of the semiconductor device.

SUMMARY OF THE INVENTION

According to an aspect of the present invention, there is provided a semiconductor device comprising: an insulative case frame having a frame portion; a lead pin block on which a plurality of lead pins with inner leads is standing, the lead pin block being installed on the inner face of the frame portion and having a base thereof; a radiator base plate covering a first opening of the insulative case frame; a circuit board on which semiconductor chips connected to the ends of the inner leads are mounted, the circuit board being bonded onto an inner face of the radiator base plate; a gel resin sealant filled in an inner space for the case frame in which the circuit board and the inner leads are immersed or covered; and an insulative cover plate for closing a second opening of the insulative case frame, wherein the semiconductor device further includes a sealant or sealing agent for closing at the side of the inner space an insertion gap between the lead pin block and the frame portion, and an air vent formed to penetrate through the base of the lead pin block.

It is preferable that the lead pin block has a first coupling claw having a step portion through which the air vent is formed, and the frame portion has on the inner face thereof a second coupling claw that couples with the first coupling claw.

According to another aspect of the present invention, there is provided a semiconductor device comprising: an insulative case frame having a frame portion; a lead pin block including a base, a plurality of lead pins standing on the base and having inner leads, and guide pins standing on the base at both sides of the lead pins, the lead pin block being installed on an inner face of the frame portion; a radiator base plate covering a first opening of the insulative case frame; a circuit board on which semiconductor chips connected to ends of the inner leads are mounted, the circuit board being bonded onto the inner face of the radiator base plate; a gel resin sealant filled in an inner space of the case frame, the circuit board and the inner leads being immersed or covered by the sealant; and an insulative cover plate for closing a second opening of the insulative case frame, wherein the semiconductor device further includes a sheath block having a plurality of lead holes and a plurality of guide holes. The lead pins and the guide pins are freely inserted into and pulled out from the lead holes and the guide holes.

It is preferable to form stopper protrusions on the base of the lead pin block so as to limit the insertion depth of the sheath block. It is also preferable to form steps on the contact face of the sheath block in the vicinity of the guide holes. Further, it is preferable to provide the sheath block with a first guide hole located on a first end thereof, a second guide hole located on a second end thereof, a third guide hole located in a middle of the lead pins, and at least one recess for separation located in the vicinity of the third guide hole.

The insertion gap between the lead pin block and the frame portion is closed on the side of the inner space of the case frame in the state that the lead pin block is installed on the case frame by the sealant or sealing agent. The sealing agent for the gap is not substantially affected by heat. The gel resin sealant heated and expanded by heat generated from the semiconductor elements does not spread through the insertion gap. As the gel resin sealant thermally expands, the air pressure in the inner space rises. However, the air vent prevents the inner pressure from rising, and the free surface level of the gel resin sealant rises without problems. Thus, excessive thermal stress and lifting up of the insulative cover plate are prevented, and the reliability of the semiconductor device is improved.

The air vent is formed through the step portion of the first coupling claw, so that the air vent may surely communicate to the outside through the gap of the second coupling claw formed on the side of the case frame. The lead pin block that has the air vent formed therein is manufactured by insertion molding without using the slider molding die, and forming the air vent through the step portion of the first coupling claw of the thus molded lead pin block. Since the slider molding die is not necessary, the manufacturing cost of the semiconductor device is reduced.

The lead pins and the guide pins are completely covered with the sheath block by inserting the sheath block onto the lead pins and the guide pins. The sheath block avoids direct contact of the pins during transporting and prevents the pins from bending or breaking. The stopper protrusions may be formed on the upper face of the base of the lead pin block for forming a space around the roots of the pins. When the sheath block is inserted, the contact face touches the stopper protrusions to form a gap around the roots of the pins. The gap facilitates pulling out the inserted sheath block.

When the guide pin is broken, the broken guide pin is repaired by bonding with an adhesive. However, the adhesive sometimes spreads away from the repaired guide pin and sticks therearound to make it difficult to insert the sheath block completely. The relief space for the spreading adhesive formed by the provision of the steps on the contact face of the sheath block adjacent to the respective guide holes facilitates insertion of the sheath block completely.

By using the sheath block having the third guide hole and at least one recess for dividing, it is facilitated to cope with the guide block having different number of lead pins. This type of the sheath block is divided along the recess when the counter part lead block has less number of lead pins.

BRIEF DESCRIPTION OF THE DRAWINGS

FIG. 6 is an exploded perspective view showing the lead pin block and its installation structure according to the prior art; and FIG. 7 is a partial cross sectional view of the insulative case frame with the lead pin block installed thereon according to the prior art.

DETAILED DESCRIPTION OF PREFERRED EMBODIMENTS

Now the present invention will be explained hereinafter with reference to the accompanied drawings which illustrate the preferred embodiments of the invention.

Figure 1A:
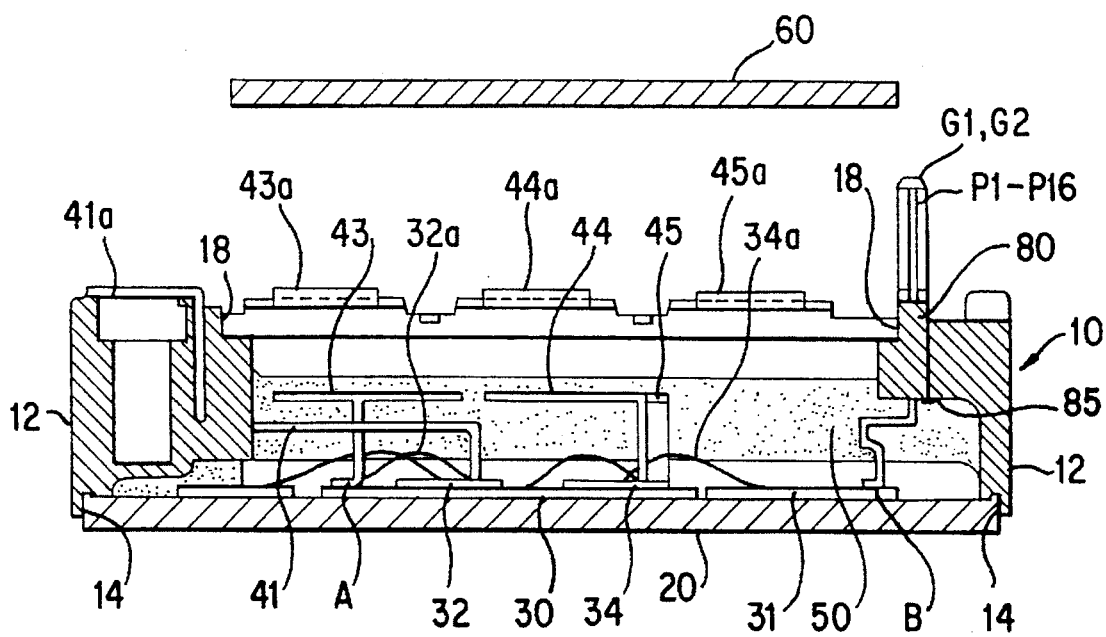
FIG. 1(a) is a cross sectional view of an embodiment of a semiconductor device according to the present invention.
Figure 1B:
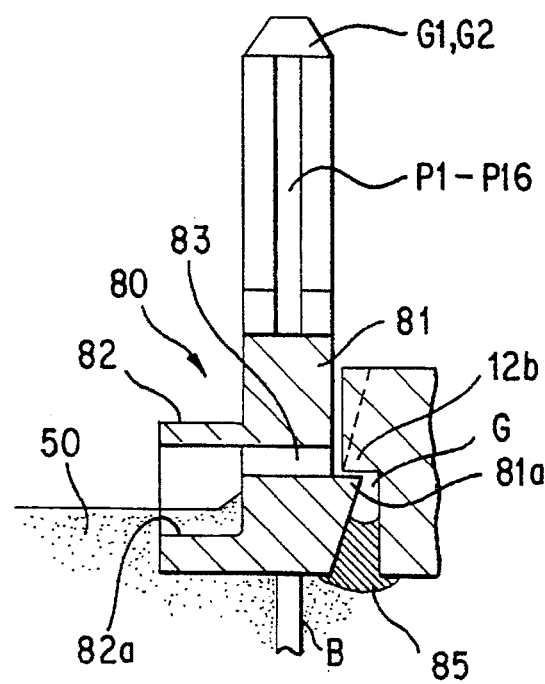
FIG. 1(b) is a partial cross sectional view showing the structure for the lead pin block of FIG. 1(a)
Figure 2:
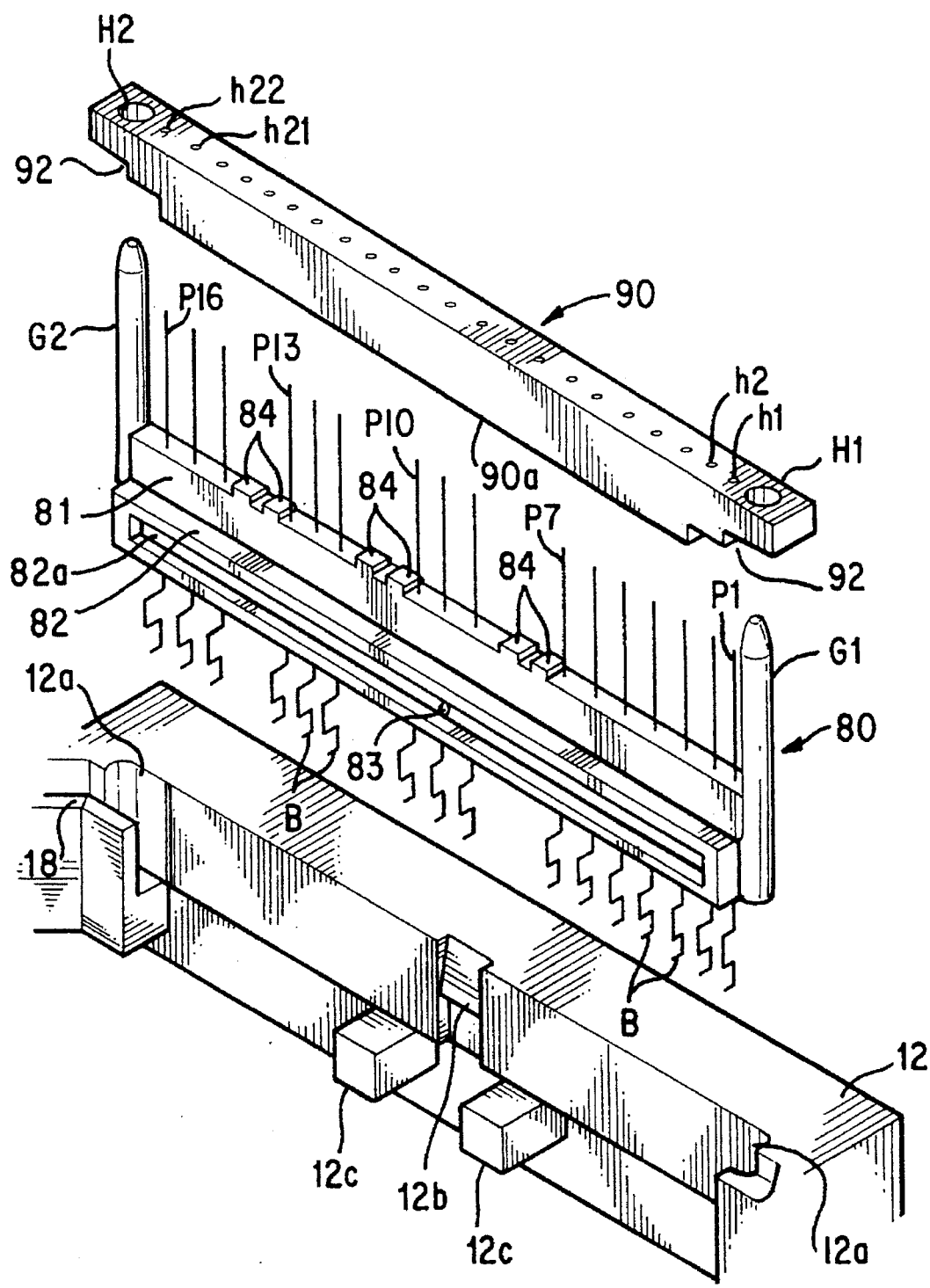
FIG. 2 is an exploded perspective view showing the structure for the lead pin block and the sheath block of the present invention.

FIG. 1(a) is a cross sectional view of an embodiment of a semiconductor device according to the present invention. FIG. 1(b) is a partial cross sectional view showing the structure for the lead pin block of FIG. 1(a). And, FIG. 2 is an exploded perspective view showing the structure for the lead pin block and the sheath block of the present invention.

Figure 4:
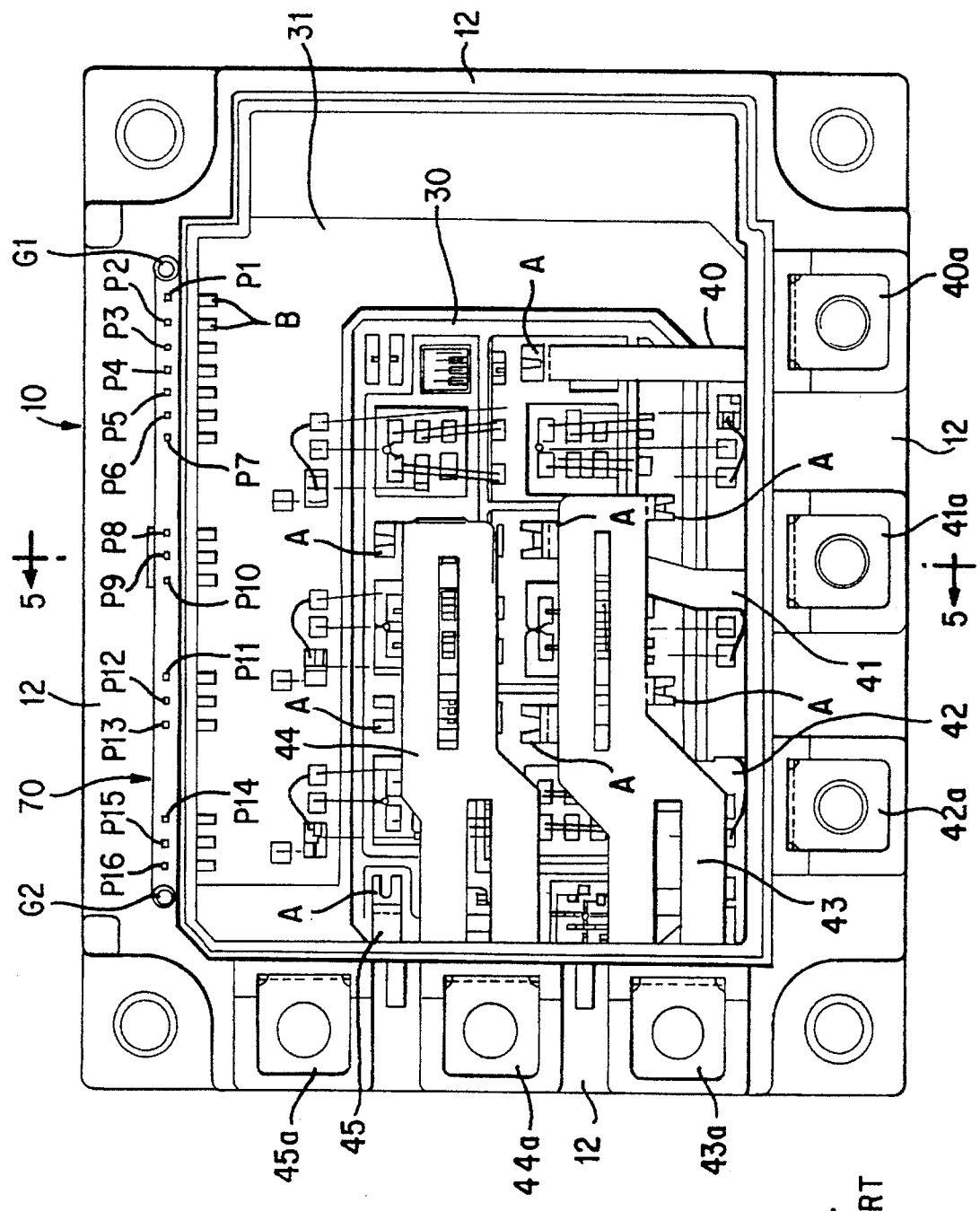
FIG. 4 is a top plan view for showing a structure of a conventional semiconductor device called "power module" or "intelligent power module"

The semiconductor device of the invention is called "power module" or "intelligent power module", which has a structure similar to that shown in FIG. 4. Referring now to FIGS. 1(a) and 1(b), the semiconductor device of the invention has an insulative case frame 10 having a frame portion 12. A radiator base plate or metal plate 20 is bonded with an adhesive to a first opening step 14 formed on the first side of the frame portion 12 to close a first opening of the case frame 10. Circuit boards 30, 31, e.g. ceramic boards, are bonded with a solder and so on to the inside face of the radiator base plate 20. Lead frames 40 through 45 are connected at the inner lead ends A thereof to a thick film wiring formed on the circuit board 30. The lead frames 41, 43, 44 and 45 are shown in FIG. 1(a).

A lead pin block 80, which is formed by an insert molding and has lead pins P1 through P16 standing thereon, is fixed to the frame portion 12 of the insulative case frame 10. The ends B of inner leads of the respective lead pins P1 through P16 are connected to the thick film wiring formed on the circuit board 31. A gel resin sealant or silicone resin 50 is filled in an inner space of the case frame to immerse or cover the circuit board 30, the inner leads of the lead frames 40 through 45 and the inner leads of the lead pins P1 through P16. An insulative cover plate 60 is bonded with an adhesive to a second opening step 18 formed on a second side of the frame portion 12 to close the second opening of the case frame 10.

Semiconductor elements or chips 32, 34, such as power transistors, IGBTs (conductivity-modulation-type transistors), diodes, thyristors, etc. are mounted on the circuit boards 30, 31. The inner lead ends A of the lead frames 40 through 45 are bonded with a solder to the thick film wiring or land portion of the circuit board 30, and connected through bonding wires 32a, 34a to the corresponding semiconductor elements 32, 34. The lead frames 40 through 45 are fixed to the frame portion 12 by an insert molding, and terminal screws (not shown) for outer connection are fixed to the terminal washers 40a through 45a of the frame portion 12.

Referring now to FIG. 2, the lead pin block 80 is molded by an insert molding separately from the insulative case frame 10. The lead pin block 80 includes a base 81 on which the lead pins P1 through P16 are standing; a step 82; a coupling claw 81a formed on the side face of the base 81 opposite to the face on which the step 82 is formed; guide pins G1, G2; an air vent 83 penetrating through the base 81 from a recess 82a of the step 82 to the step portion of the coupling claw 81; and a plurality of stopper protrusions 84 formed on the upper face of the base 81. The upper face of the step 82 is positioned at the same height as the upper face of the second opening step 18 when the step 82 is inserted into slots 12a formed on the inner face of the frame portion 12 of the insulative case frame 10. The step 82 receives the insulative cover plate 60. The coupling claw 81a couples with a wedge-shaped coupling claw 12b formed on the inner face of the frame portion 12 (FIG. 1(b)). The guide pins G1, G2 are inserted into respective guide holes formed on a female connector (not shown) for the lead pins P1 through P16.

The lead pin block 80 is installed on the insulative case frame 10 tightly enough not to come out easily by inserting the lead pin block 80 into the slots 12a and coupling the coupling claw 12b of the frame portion 12 and the coupling claw 81a of the lead pin block 80 with one another. In this embodiment, the insertion gap G between the lead pin block 80 and the frame portion 12 is closed with a sealant 85, such as adhesive, on the side of the inner space of the case frame 10. The inner space of the case frame communicates with the outside through the air vent 83. The sealant 85 is not substantially affected by heat, e.g. not expanding or enlarging volume. Preferably, the sealant 85 is an epoxy type adhesive (NX-022B by Sumitomo-Three M Co., Ltd.), which, when it is solidified, becomes hard to increase location accuracy of the lead pin block 80.

In the invention, under the condition that the lead pin block 80 is inserted into the slots 12a and installed on the case frame 10, the insertion gap G between the lead pin block 80 and the frame portion 12 is closed on the side of the inner space of the case frame 10. Therefore, even if the gel resin sealant 50 is heated and expanded by the heat generated from the semiconductor chips 32, 34, the sealant 50 does not spread or leak through the gap G. As the gel resin sealant 50 thermally expands, air pressure in the inner space rises. However, the air vent 83 prevents the inner pressure from rising, and the free surface level of the gel resin sealant 50 rises without problem. Thus, excessive thermal stress and lifting up of the insulative cover plate 60 are prevented, and the reliability of the semiconductor device is improved. In this embodiment, the air vent 83 is formed through the step portion of the coupling claw 81a, so that air can surely flow to the outside through the gap of the coupling claw 12b formed on the side of the case frame 10. The lead pin block 80 with the air vent 83 formed therein is manufactured by the insertion molding without using a slider molding die, and forming the air vent 83 through the step portion of the coupling claw 81a of the thus molded lead pin block. Since the slider molding die is not required, the manufacturing cost of the semiconductor device is reduced.

As shown in FIG. 2, a sheath block 90 made of resin has lead holes h1 through h22 corresponding to the lead pins P1 through P16 and guide holes H1, H2 corresponding to the guide pins G1, G2. The lead pins P1 through P16 are freely inserted into and pulled out from the lead holes h1 through h22. The guide pins G1, G2 are freely inserted into and pulled out from the guide holes H1, H2, as well. Also, double-steps 92 having two steps thereon are formed on a contact face 90a of the sheath block 90 on the sides of the respective guide holes H1, H2.

The lead pins and the guide pins are completely covered with the sheath block by inserting the sheath block 90 onto the lead pins P1 through P16 and the guide pins G1, G2. The sheath block 90 avoids direct contact of the pins during transporting and prevents the pins from bending or breaking. The stopper protrusions 84 are formed on the upper face of the base 81 of the lead pin block 80 for forming the spaces between the respective terminal groups. When the sheath block 90 is inserted, the contact face 90a touches the stopper protrusions 84 to form a gap around the roots of the pins. The gap facilitates pulling out the inserted sheath block 90.

If the guide pin G1 or G2 is broken, the broken guide pin is repaired by bonding with an adhesive. However, the adhesive sometimes spreads away from the repaired guide pin and sticks therearound to make it difficult to insert the sheath block completely. To avoid this problem, the double-steps 92 having two steps thereon are formed on the contact face 90a of the sheath block 90 on each side of the respective guide holes H1, H2 so as to provide a relief space for the spreading adhesive. Thus, the sheath block 90 is inserted easily onto the repaired guide pin.

Figure 3A:
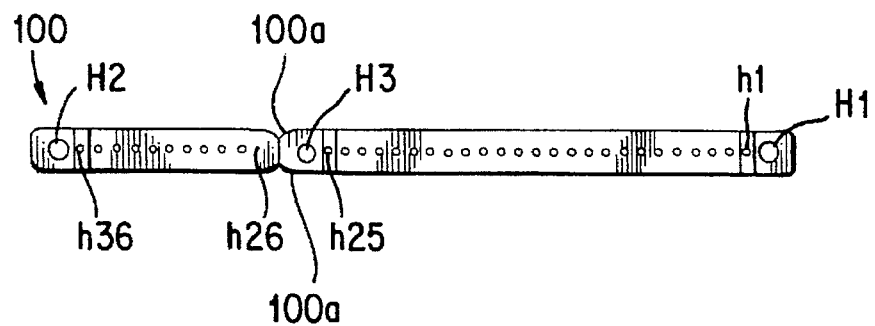
FIG. 3(a) is a top plan view of another sheath block according to the present invention.
Figure 3B:
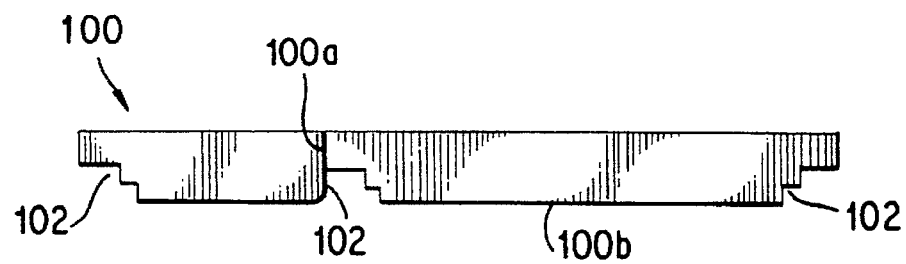
FIG. 3(b) is a front plan view of the sheath block of FIG. 3(a)
Figure 5:
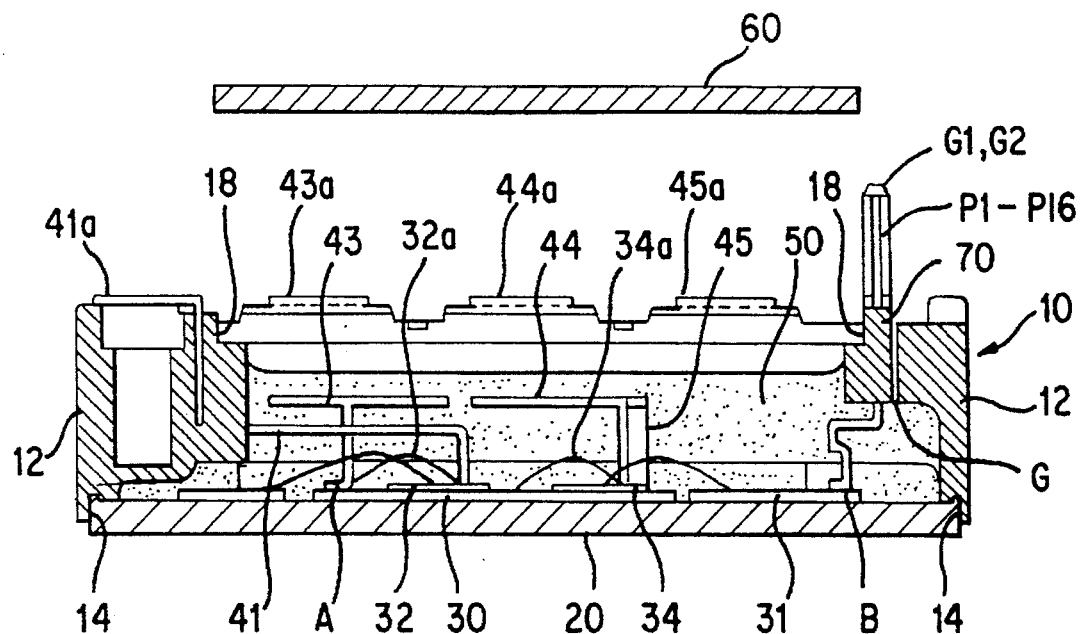
FIG. 5 is a cross sectional view taken along line 5—5 in FIG. 4.

FIG. 3(a) is a top plan view of another sheath block according to the present invention, and FIG. 3(b) is a front plan view of the sheath block of FIG. 3(a). This sheath block 100 has a first guide hole H1 formed in one end of the sheath block 100, a second guide hole H2 formed in the other end of the sheath block 100, and a third guide hole H3 formed in a middle of guide holes P1 through P36. The guide holes P1 through P25 are located between the first guide hole H1 and the third guide hole H3. Recesses 100a for separation are formed on the front and rear faces of the sheath block 100 between the third guide hole H3 and the guide pin 26. Double-steps 102 are formed on a contact face 100b of the sheath block 100 near the guide holes H1, H2 and H3.

This sheath block 100 copes with a lead pin block having different number of lead pins thereon. For protecting the lead pin block having 36 lead pins thereon, the sheath block 100 is used in the state as shown in FIGS. 3(a) and 3(b). For protecting the lead pin block having 25 lead pins thereon, the sheath block 100 is divided along the recesses 100a, and the sub-block having the guide holes H1 and H3 is used. Thus, the sheath block 100 facilitates reducing the cost of the mold.

As has been explained above, the semiconductor device of the invention is featured by a lead pin block having an air vent formed therein. The semiconductor device of the invention is also featured by a sheath block that covers and protects the pins standing on the lead pin block. Therefore, the semiconductor device of the invention exhibits the following effects.

Since the insertion gap between the lead pin block and the frame portion is closed on the side of the inner space of the case frame with a sealant or sealing agent, the gel resin sealant heated and expanded by heat generated from the semiconductor chips never spreads out through the insertion gap. Since the air vent prevents the inner pressure from rising and since the free surface level of the gel resin sealant rises without problems, excessive thermal stress and lifting up of the insulative cover plate 60 are prevented.

In case the air vent is formed in the step portion of the coupling claw of the lead pin block that couples with the coupling claw of the case frame, the lead pin block is manufactured easily with reduced cost by molding the lead pin block without using the slider molding die, and forming the air vent in the step of the coupling claw of the molded lead pin block.

Since the lead pins and the guide pins of the lead pin block are completely covered with the sheath block by inserting the sheath block over the lead pins and the guide pins, the pins are prevented from contact, deformation, and breakage during transporting.

Since the inserted sheath block stops at the stopper protrusions formed on the upper face of the base of the lead pin block and a gap is left around the roots of the pins, the inserted sheath block may be pulled out easily.

The double-steps having two steps are formed on the contact face of the sheath block adjacent to the respective guide holes. Since the steps form a relief space for an adhesive used in fixing the guide pin, the sheath block can be inserted completely.

By using the sheath block that has the third guide hole and recesses for dividing, it is facilitated to cope with guide blocks having different number of lead pins. This type of sheath block is divided along the recesses when the counter part lead block has less number of lead pins.

What is claimed is:

1. A semiconductor device comprising:

an insulative case frame having a frame portion, and first and second openings;

a lead pin block having a base and a plurality of lead pins with inner leads formed in the base, said lead pin block being installed inside the frame portion;

a base plate attached to the frame portion for covering the first opening;

a circuit board bonded to an inner face of the base plate and having semiconductor chips thereon connected to ends of the inner leads;

a gel resin sealant filling an inner space of the insulative case frame over the circuit board and the semiconductor chips;

an insulative cover plate placed on the insulative case frame for closing the second opening of the insulative case frame;

a sealing agent disposed between the lead pin block and the frame portion to seal a gap therebetween; and an air vent formed in the base of the lead pin block to communicate between the inner space and atmosphere.

2. A semiconductor device according to claim 1, wherein said lead pin block includes a first coupling claw having a step portion, and the frame portion includes a second coupling claw formed on an inner face thereof to engage with the first coupling claw, said air vent being formed in the step portion of the first coupling claw.

3. A semiconductor device according to claim 1, wherein said lead pin block further includes guide pins standing on both ends of the lead pins, said semiconductor device further including a sheath block having a plurality of lead holes and a plurality of guide holes, said lead pins and the guide pins being freely inserted into and pulled out from the lead holes and the guide holes.

4. A semiconductor device according claim 3, wherein said base of the lead pin block includes stopper protrusions to limit insertion length of the sheath block.

5. A semiconductor device according to claim 4, wherein said sheath block includes steps at a bottom thereof near the guide holes.

6. A semiconductor device according to claim 3, wherein said sheath block includes a first guide hole located in one end, a second guide hole located in the other end thereof, a third guide hole located between the first and second guide holes, and at least one recess located near the third guide hole.

7. A semiconductor device according to claim 1, wherein said sealing agent disposed between the lead pin block and the frame portion is located inside the inner space of the insulative case frame, said sealing agent being strong against heat without changing properties thereof.

\* \* \* \* \*